United States Patent
Ahn et al.

(10) Patent No.: US 11,141,801 B2
(45) Date of Patent: Oct. 12, 2021

(54) CUTTING TOOL HAVING PARTIALLY-REMOVED FILM FORMED THEREON

(71) Applicant: KORLOY INC., Seoul (KR)

(72) Inventors: Seung-Su Ahn, Cheongju-si (KR); Je-Hun Park, Cheongju-si (KR); Kyung-il Kim, Cheongju-si (KR); Sung-Hyun Kim, Cheongju-si (KR); Sung-Gu Lee, Cheongju-si (KR); Sun-Yong Ahn, Cheongju-si (KR)

(73) Assignee: KORLOY INC., Seoul (KR)

( * ) Notice: Subject to any disclaimer, the term of this patent is extended or adjusted under 35 U.S.C. 154(b) by 0 days.

(21) Appl. No.: 16/846,439

(22) Filed: Apr. 13, 2020

(65) Prior Publication Data

US 2020/0238403 A1 Jul. 30, 2020

Related U.S. Application Data

(62) Division of application No. 15/109,656, filed as application No. PCT/KR2015/003875 on Apr. 17, 2015, now abandoned.

(30) Foreign Application Priority Data

Apr. 23, 2014 (KR) .......................... 10-2014-0048442

(51) Int. Cl.
  *B23C 5/16* (2006.01)
  *B23B 51/00* (2006.01)
  *B23C 5/10* (2006.01)

(52) U.S. Cl.
  CPC .............. *B23C 5/1009* (2013.01); *B23C 5/16* (2013.01); *B23B 2224/04* (2013.01);
  (Continued)

(58) Field of Classification Search
  CPC . B23B 51/02; B23B 2251/12; B23B 2251/14; B23B 2251/18; B23B 2228/10;
  (Continued)

(56) References Cited

U.S. PATENT DOCUMENTS 4,620,822 A 11/1986 Haque et al.
4,629,373 A 12/1986 Hall
(Continued)

FOREIGN PATENT DOCUMENTS

DE 102011000793 A1 * 8/2012 ............. B23B 51/02
DE 102014103906 A1 * 9/2015 ............. B23B 51/06
(Continued)

OTHER PUBLICATIONS

International Search Report for PCT/KR2015/003875 dated Jul. 6, 2015 from Korean Intellectual Property Office.

*Primary Examiner* — Ryan Rufo
(74) *Attorney, Agent, or Firm* — Revolution IP, PLLC

(57) ABSTRACT

The present invention relates to a cutting tool, which performs, like a drill or a ball end mill, cutting while rotating in a state in which the center of the tip end is in contact with a work material, and includes a wear-resistant layer formed at the tip end thereof, wherein a portion of the wear-resistant layer is selectively removed through tip end polishing from the center of the tip end of the drill or the ball end mill to a predetermined area, so as to restrain micro-brittle wear generated in an ultra-low speed region, and thus remarkably improving the cutting lifespan of the cutting tool such as the drill or the ball end mill.

5 Claims, 11 Drawing Sheets

(52) U.S. Cl.
CPC ....... *B23B 2224/32* (2013.01); *B23B 2228/10* (2013.01); *B23B 2228/36* (2013.01); *B23C 2224/04* (2013.01); *B23C 2224/32* (2013.01); *B23C 2228/10* (2013.01)

(58) Field of Classification Search
CPC ............ B23B 2224/04; B23B 2224/32; B23B 2228/36; B23C 5/10; B23C 5/109; B23C 5/1009; B23C 2228/10; B23C 2224/04; B23C 2224/32
See application file for complete search history.

(56) References Cited

U.S. PATENT DOCUMENTS

| | | | |
|---|---|---|---|
| 4,728,231 A | | 3/1988 | Kunimori et al. |
| 4,784,023 A | | 11/1988 | Dennis |
| 5,022,801 A | | 6/1991 | Anthony et al. |
| 5,037,704 A | | 8/1991 | Nakai |
| 5,137,398 A | | 8/1992 | Omori et al. |
| 5,379,854 A | * | 1/1995 | Dennis ................ E21B 10/5673 175/426 |
| 5,467,670 A | | 11/1995 | Alverio |
| 5,709,907 A | | 1/1998 | Battaglia et al. |
| 5,873,683 A | | 2/1999 | Krenzer |
| 6,161,990 A | * | 12/2000 | Oles ...................... B23B 27/145 407/113 |
| 6,508,150 B1 | * | 1/2003 | Bertschinger ......... C23C 28/044 407/1 |
| 6,524,036 B1 | * | 2/2003 | Kolker .................... C21D 9/22 409/131 |
| 6,551,035 B1 | | 4/2003 | Bruhn |
| 7,695,222 B2 | * | 4/2010 | Omori ................... C23C 28/042 407/119 |
| 7,785,700 B2 | * | 8/2010 | Okada .................. C23C 30/005 428/216 |
| 7,837,416 B2 | * | 11/2010 | Omori ..................... C23C 16/04 407/113 |
| 8,003,234 B2 | | 8/2011 | Omori et al. |
| 9,144,845 B1 | | 9/2015 | Grzina |
| 10,183,343 B2 | * | 1/2019 | Roth ...................... B23B 51/02 |
| 2002/0039521 A1 | | 4/2002 | Votsch et al. |
| 2002/0187370 A1 | * | 12/2002 | Yamagata ............. C23C 30/005 428/698 |
| 2003/0161696 A1 | | 8/2003 | Fritsch et al. |
| 2004/0101379 A1 | | 5/2004 | Mabuchi et al. |
| 2005/0249562 A1 | | 11/2005 | Frejd |
| 2007/0087211 A1 | | 4/2007 | Endres |
| 2007/0160436 A1 | * | 7/2007 | Weerasunghe ........ C23C 14/042 408/230 |
| 2007/0248424 A1 | * | 10/2007 | Omori ..................... B23C 5/202 407/113 |
| 2008/0014421 A1 | | 1/2008 | Inspektor et al. |
| 2008/0028684 A1 | | 2/2008 | Schier |
| 2008/0131218 A1 | | 6/2008 | Omori et al. |
| 2009/0003944 A1 | | 1/2009 | Omori et al. |
| 2009/0185875 A1 | * | 7/2009 | Frank .................... B23B 27/141 407/114 |
| 2009/0274525 A1 | * | 11/2009 | Omori ....................... B23C 5/20 407/119 |
| 2010/0021253 A1 | | 1/2010 | Frejd |
| 2010/0061821 A1 | | 3/2010 | Okumura |
| 2012/0063857 A1 | | 3/2012 | Onozawa |
| 2012/0148358 A1 | | 6/2012 | Hecht et al. |
| 2013/0302102 A1 | | 11/2013 | Green et al. |
| 2014/0338512 A1 | * | 11/2014 | Suzuki ................. B26D 1/0006 83/651 |
| 2015/0016900 A1 | | 1/2015 | Jansson |
| 2015/0117972 A1 | * | 4/2015 | Osaki .................... B23C 5/1009 407/115 |
| 2015/0225840 A1 | * | 8/2015 | Andersson ............. B23C 5/006 407/119 |
| 2015/0231703 A1 | * | 8/2015 | Bjormander .......... B23B 27/146 428/162 |
| 2015/0298215 A1 | * | 10/2015 | Bjormander .......... C23C 28/044 407/115 |
| 2016/0243625 A1 | * | 8/2016 | Waki ....................... C23C 16/26 |
| 2016/0297010 A1 | | 10/2016 | Kukino et al. |
| 2017/0341159 A1 | * | 11/2017 | Ogawa .................... B23B 51/00 |

FOREIGN PATENT DOCUMENTS

| | | | |
|---|---|---|---|
| JP | 05044012 A | * | 2/1993 |
| JP | 05-337717 A | | 12/1993 |
| JP | 08-127863 A | | 5/1996 |
| JP | 2001-225216 A | | 8/2001 |
| JP | 2003-275910 A | | 9/2003 |
| JP | 2004-299017 A | | 10/2004 |
| JP | 2005-279887 A | | 10/2005 |
| JP | 2007-245270 A | | 9/2007 |
| JP | 2011-206897 A | | 10/2011 |
| KR | 20-1985-0009757 U | | 12/1985 |
| KR | 10-2006-0130196 A | | 12/2006 |
| KR | 10-1190528 B1 | | 10/2012 |
| WO | WO-2006073233 A1 | * | 7/2006 ........... B23B 27/145 |

\* cited by examiner

[FIG. 1]
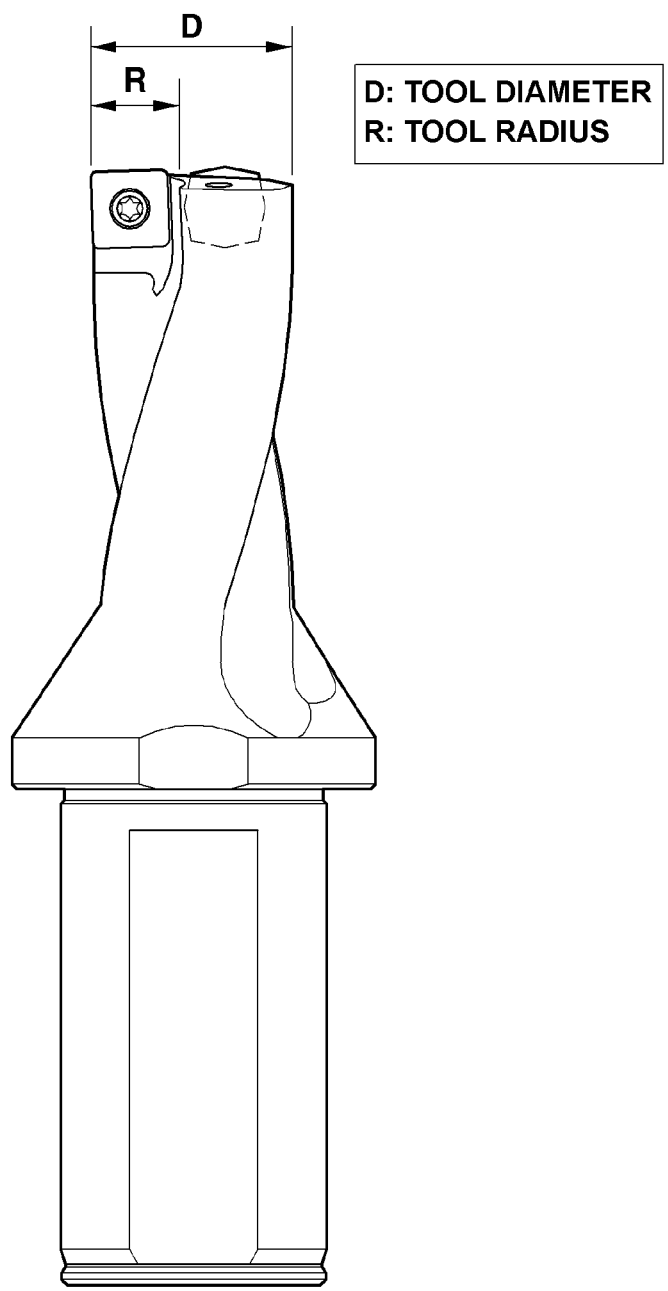
D: TOOL DIAMETER
R: TOOL RADIUS

[FIG. 2]
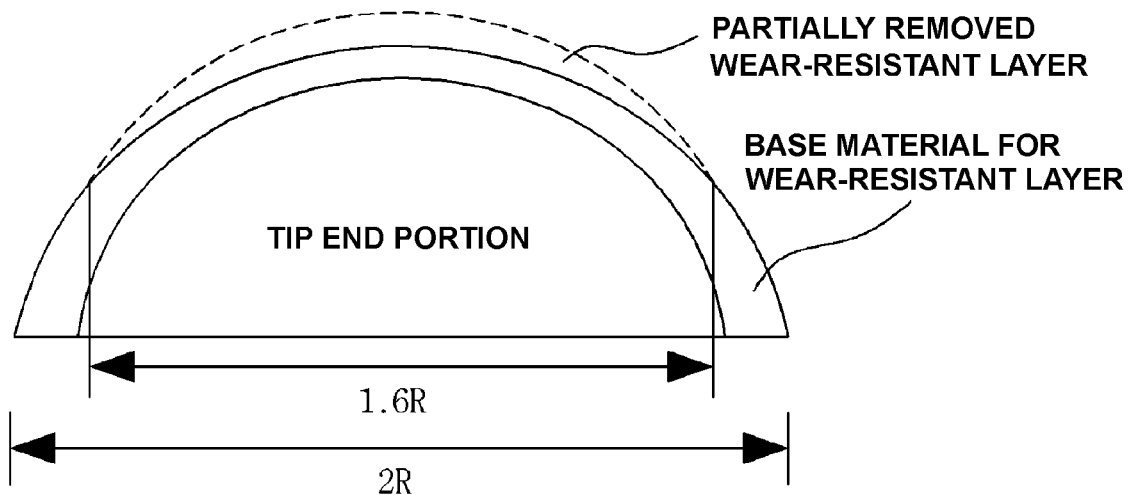
[FIG. 3]
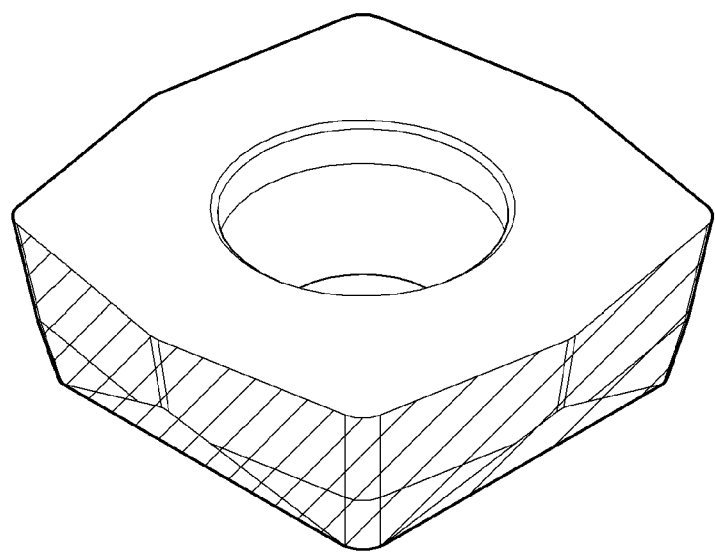

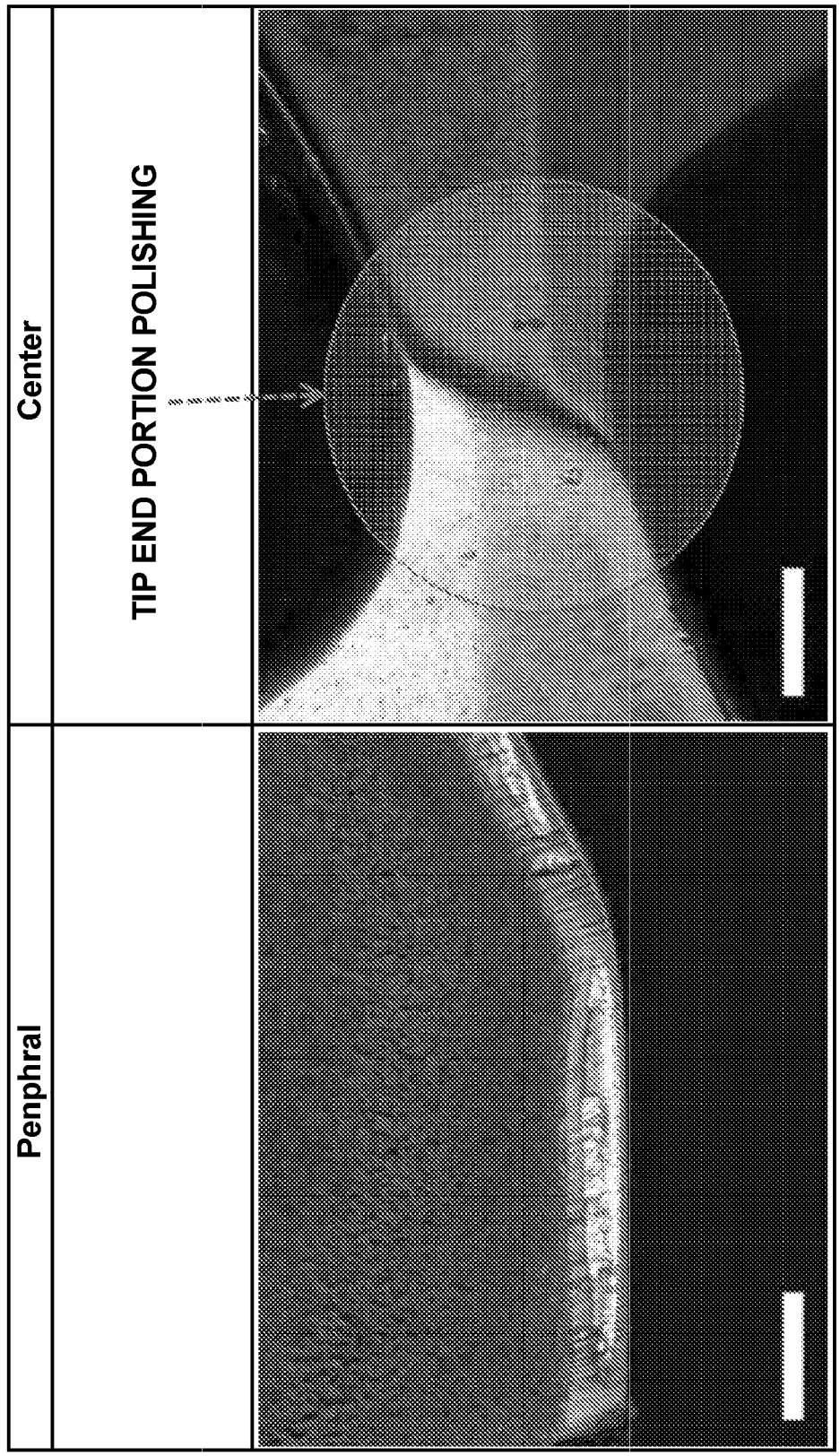
[FIG. 4]

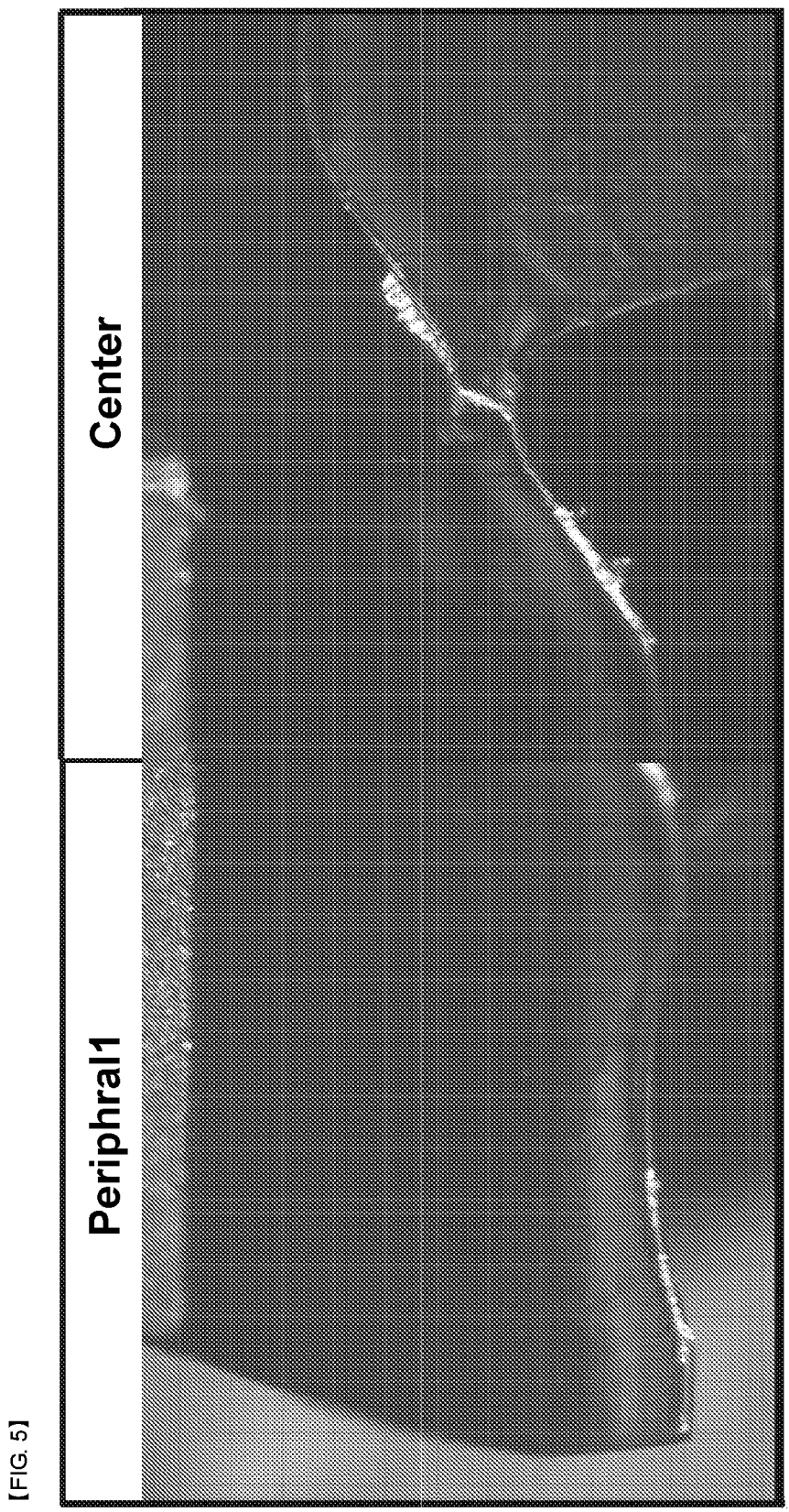
[FIG. 5]

【FIG. 6】
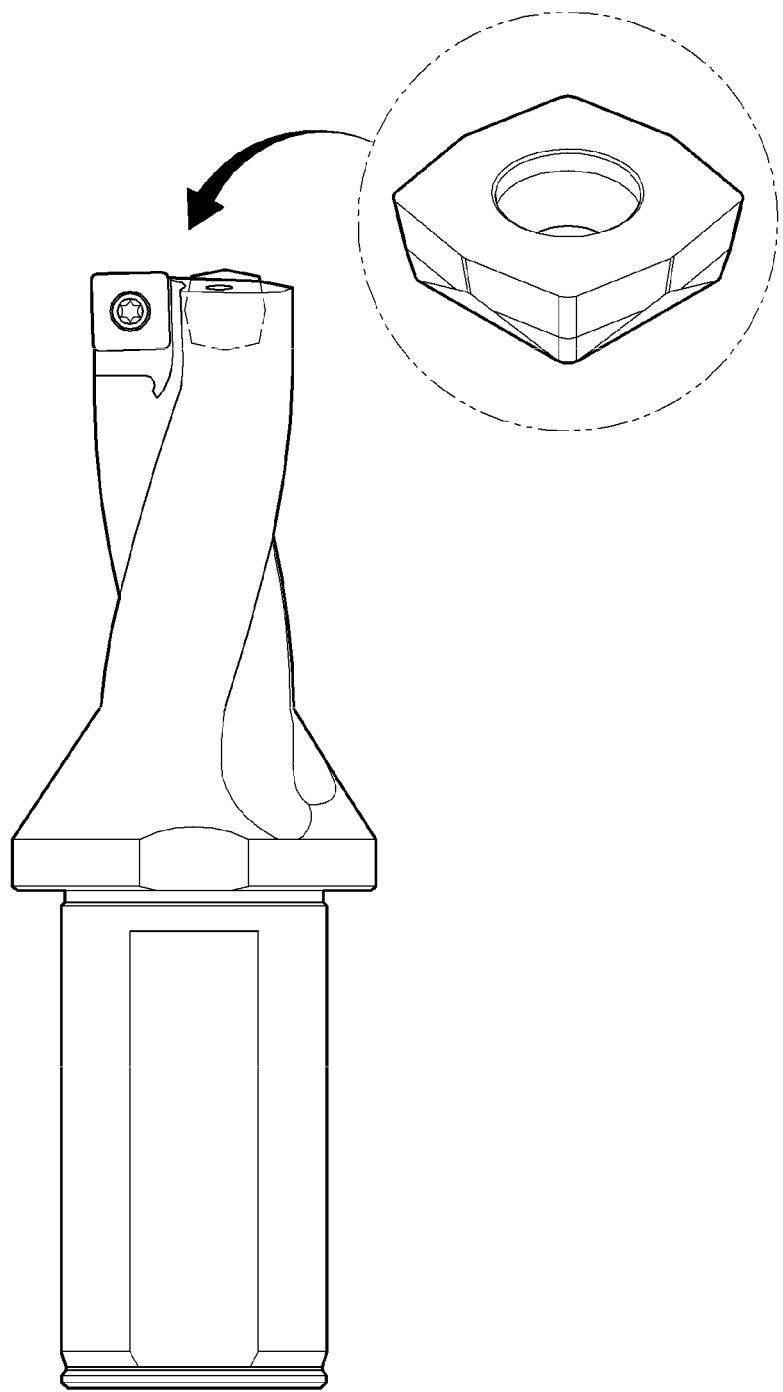

[FIG. 7]
| INSERT | COMPARATIVE EXAMPLE 5 | EXAMPLE 3 |
|---|---|---|
| PHOTOGRAPH | 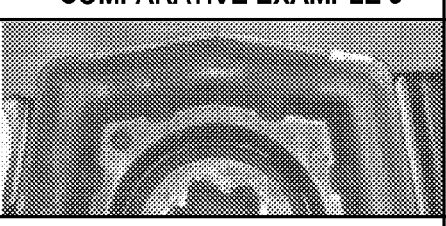 | 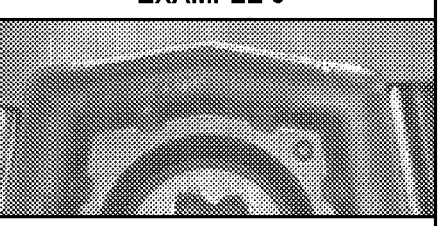 |
| NUMBER OF CUTTING | 130 Hole | 130 Hole |

[FIG. 8]

| INSERT | COMPARATIVE EXAMPLE 5 | COMPARATIVE EXAMPLE 5 |
|---|---|---|
| PHOTOGRAPH | | |
| LIFESPAN | 52 hole ( 5.0m ) | 26 hole ( 2.3m ) |
| CAUSE OF LIFESPAN END | INNER BLADE CORNER BREAKAGE, OUTER BLADE EDGE FALLING-OFF | INNER BLADE CORNER BREAKAGE, OUTER BLADE EDGE FALLING-OFF |
| INSERT | EXAMPLE 3 | EXAMPLE 3 |
| PHOTOGRAPH | | |
| LIFESPAN | 156 hole ( 14.4m ) | 130 hole ( 12.1m ) |
| CAUSE OF LIFESPAN END | OUTER BLADE BOUBARY EDGE FALLING OFF | INNER AND OUTER BLADES CORNER BREAKAGE |

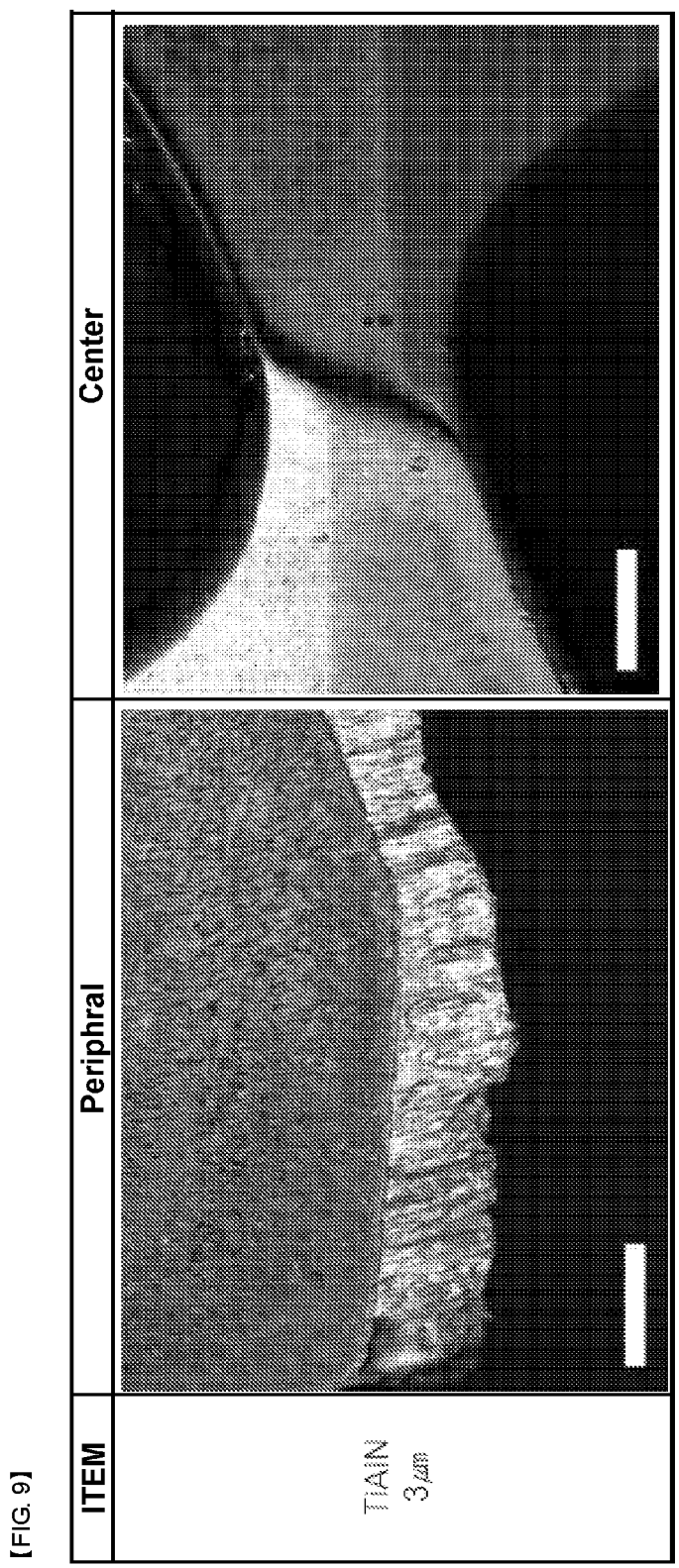
[FIG. 9]

[FIG. 10]
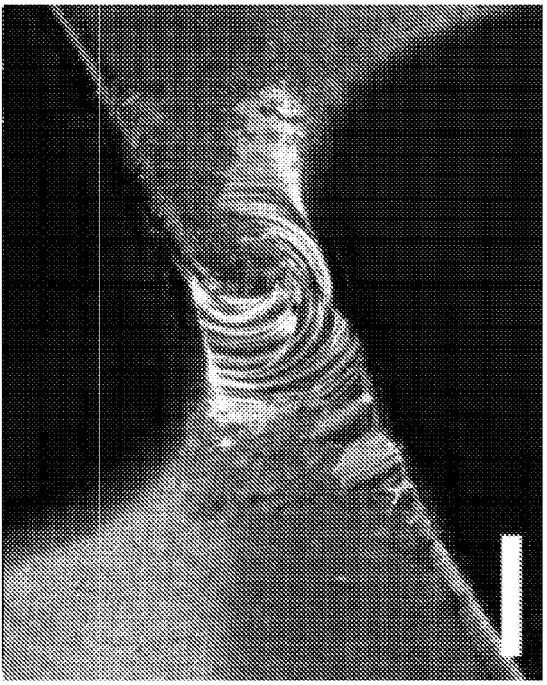

[FIG. 11]
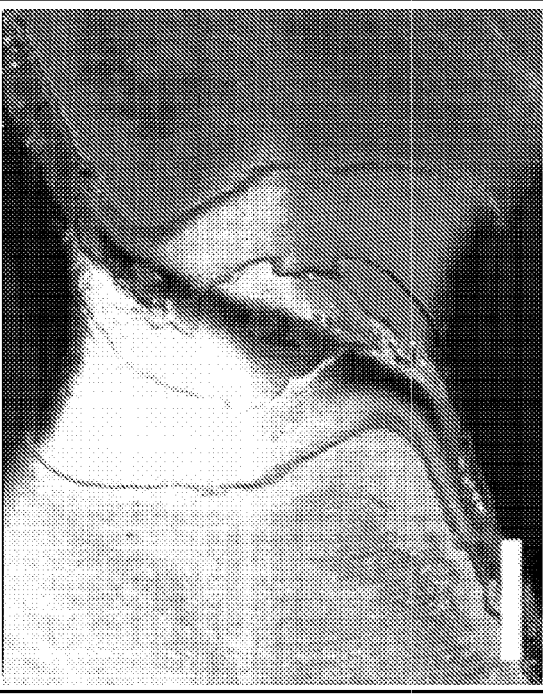

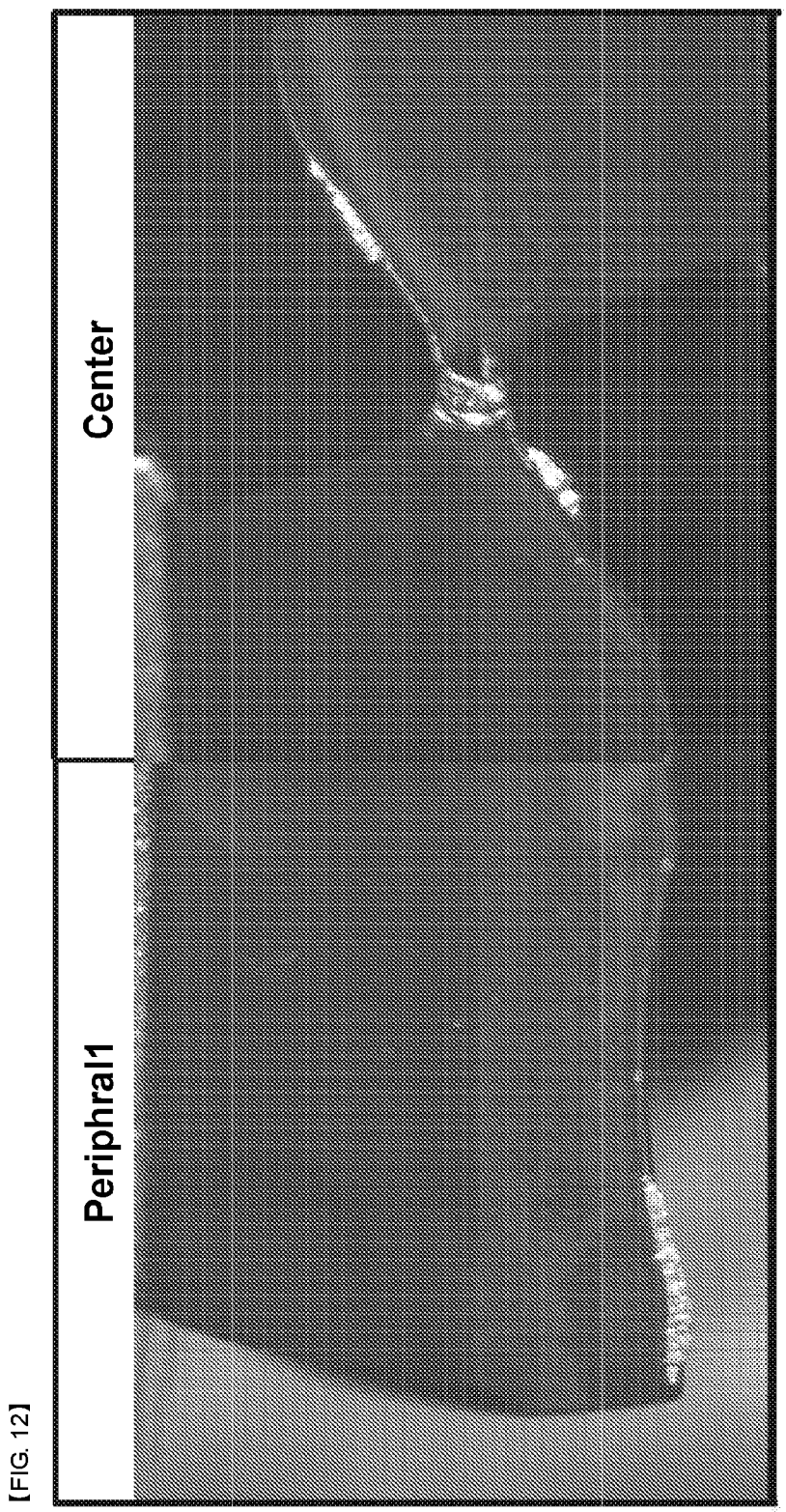
[FIG. 12]

CUTTING TOOL HAVING PARTIALLY-REMOVED FILM FORMED THEREON

CROSS REFERENCE TO PRIOR APPLICATIONS

This application is a division of U.S. patent application Ser. No. 15/109,656 filed Jul. 4, 2016, which is the National Stage Application of PCT International Patent Application No. PCT/KR2015/003875 filed on Apr. 17, 2015, under 35 U.S.C. § 371, which claims priority to Korean Patent Application No. 10-2014-0048442 filed on Apr. 23, 2014, which are all hereby incorporated by reference in their entirety.

TECHNICAL FIELD

The present invention relates to a cutting tool having a layer partially removed through a tip end polishing, and more particularly, to a cutting tool which performs, like a drill or a ball end mill to cut while being rotated in a state in which the center of the tip end is in contact with a work material, and includes a wear-resistant layer formed at the tip end thereof, wherein a portion of the wear-resistant layer is selectively removed through tip end polishing from the center of the tip end of the drill or the ball end mill to a predetermined area, so as to restrain micro-brittle wear generated in an ultra-low speed region, thus remarkably improving the cutting lifespan of the cutting tool such as the drill or the ball end mill.

BACKGROUND ART

A drill is a cutting tool used to cut circular holes in a workpiece. Cutting blades of the drill are spirally formed along an outer circumferential portion of a rod-shaped material which is made of steel or super hard alloy, and the tip end of the drill is formed in a conical shape.

A ball end mill has a shape similar to the drill and has a ball-shaped tip end, and is thereby a tool mainly used to cut a curved surface.

Such tools, like drills or ball end mills, have a conical tip end or a ball-shaped tip end the center portion of which is in contact with a work material during cutting, and performs the cutting while being rotated about the center portion.

To improve the cutting lifespan, a single layer or a multi-layered wear-resistant layer which is formed of a hard material, such as TiCN, TiAlN, TiAlCrN, or $Al_2O_3$, is formed on a portion in which cutting is really performed, in the drill or a ball end mill.

When a tool such as a drill or a ball end mill is rotated, since a tip end and a cutting blade which are in contacting with a working material have speeds increased proportional to a value of a radius R from a center point which is a base point, the center point is in contact with the work material with a low speed, and the farther a portion from the center points, the higher the speed of the portion in contact with the work material.

Furthermore, the center portions of a drill and a ball end mill are in contact with a work material with a ultra-low speed, but in these ultra-low speed region, so-called micro-brittle wear is generated due to fatigue, and particularly, a high-pressure formed by a high feed speed in high-feed drilling functions to accelerate the micro-brittle wear of the center portion of a bottom cutting edge, and this becomes a main cause for degrading a tool lifespan of a drill or a ball end mill.

Also, a cover layer for additional decoration or for identifying whether to use is also formed on a wear-resistant layer in a cutting tool on which a wear-resistant layer is formed, and when the cover layer is thus formed, the formed cover layer should be easily removed without damage to the wear-resistant layer. Korean Patent Application No. 2006-0130196 discloses a technical feature in which a separation layer is additionally provided between the wear-resistant layer and the cover layer such that the cover layer is easily detached.

However, the technical feature is disclosed to remove the damage to the wear-resistant layer when the cover layer is removed before performing a main cutting work, not to provide a concept of improving a cutting lifespan by peeling off the wear-resistant layer itself.

DISCLOSURE OF THE INVENTION

Technical Problem

The purpose of the present invention is to provide a cutting tool capable of preventing the decrease in a cutting lifespan of a cutting tool caused by micro-brittle wear generated in a cutting tool such as a drill or a ball end mill.

Technical Solution

According to an aspect of the present invention, provided is a cutting tool formed in a columnar shape to cut a work material by being rotated while a center of a tip end thereof is in contact with the work material, wherein the base material for the tip end of the cutting tool is a sintered alloy, a wear-resistant layer is formed on the tip end, and a portion of or the entirety of the wear-resistant layer is removed within a distance of 0.01 R to 0.8 R (R: a radius of the column-shaped tool) from a center of the tip end.

According to another aspect of the present invention, provided is cutting tool formed in a columnar shape to cut a work material by being rotated while a center of a tip end thereof is in contact with the work material, wherein the tip end comprises one or more detachable and indexible inserts, the inserts each have a sintered alloy as a base material, a wear-resistant layer is formed on a surface of each insert, and a portion of or the entirety of the wear-resistant layer is removed within a distance of 0.01 R-0.8 R (where, R is a radius of the column-shaped tool) from the rotation center of the tip end.

Advantageous Effects

According to the present invention, a portion of a wear-resistant layer formed on a tip end of a tool such as a drill or a ball end mill is selectively removed within a distance of 0.01 R-0.8 R (where, R is the radius of the column-shaped tool) from a center of a tip end, so that wear and the propagation of the wear caused by micro-brittle wear typically generated in a drill or a ball end mill are prevented, and the cutting lifespan of a drill or a ball end mill can thereby be remarkably improved.

Also, according to the present invention, a portion of a wear-resistant layer formed on a clearance surface of an insert detachably fastened to a tip end of a tool such as a drill or a ball end mill is selectively removed within a distance of 0.01 R-0.8 R (where, R is a radius of the column-shaped tool) from the center of the tip end, and therefore, wear and the propagation of the wear caused by micro-brittle wear generated during cutting are prevented, and the lifespan of an insert can thereby be remarkably improved.

BRIEF DESCRIPTION OF THE DRAWINGS

FIG. 1 is a view illustrating a "tool radius R" in a drill having one or more fixed indexible inserts which can be attached/detached on a shank part and a tip end of a column-shaped drill body.

FIG. 2 is a schematic view illustrating a tip end in which a wear-resistant layer is optionally removed according to the present invention.

FIG. 3 is a schematic view illustrating a state (shadowed portion in the drawing) in which a wear-resistant layer formed in a clearance surface of an insert fastened to a drill in an indexible manner has been removed.

FIG. 4 is a photograph showing a center and a periphery of a tip end of a drill after performing drilling by means of a drill having a partially removed wear-resistant layer according to example 1 of the present invention.

FIG. 5 is a photograph showing a center and a periphery of a tip end of a drill after performing drilling by means of a drill having a partially removed wear-resistant layer according to example 2 of the present invention.

FIG. 6 is a perspective view illustrating a process of fixing two or more detachable and indexible inserts to a tip end of a shank part and a column-shaped drill body.

FIG. 7 illustrates photographs showing states of inserts after performing cutting tests (130 holes) by means of drills provided with inserts according to example 3 and comparative example 5 of the present invention.

FIG. 8 illustrates photographs showing a number of drilled holes until an end of lifespan, causes of the end of lifespan, and states of inserts after performing cutting tests under a different cutting condition by means of drills provided with inserts according to example 3 and comparative example 5 of the present invention.

FIG. 9 is a photograph showing a center and a periphery of a tip end of a drill after performing drilling by means of a drill having a wear-resistant layer formed therein according to comparative example 1.

FIG. 10 is a photograph showing a center and a periphery of a tip end of a drill after performing drilling by means of a drill having a wear-resistant layer formed therein according to comparative example 2.

FIG. 11 is a photograph showing a center and a periphery of a tip end of a drill after performing drilling by means of a drill having a wear-resistant layer formed therein according to comparative example 3.

FIG. 12 is a photograph showing a center and a periphery of a tip end of a drill after performing drilling by means of a drill having a wear-resistant layer formed therein according to comparative example 4.

MODE FOR CARRYING OUT THE INVENTION

Hereinafter, embodiments of the present invention will be described in detail with reference to the accompanying drawings. However, exemplary embodiments of the present invention that will be described below may be modified into various forms, and the scope of the present invention should not be construed as limited to the embodiments to be described below in detail. The embodiments of the present invention are provided so that this disclosure will be more completely described to those skilled in the art.

In the present invention, a "tool radius R" of a common drill or a common end mill are radii of a column part of a column-shaped tool and means a radius in case of a circular shape, and means the radius of an inscribing circle in case of a polygonal shape.

Particularly, in case of a drill or an end mill provided with an indexible insert, as illustrated in FIG. 1, the "tool radius R" is the radius of a column-shaped tip end, means a radius in case of a circular shape, and means the radius of an inscribing circle in case of a polygonal shape.

As a result of research for solving the decrease in a tool lifespan due to micro-brittle wear generated in an ultra-low speed region at a central part during cutting by using a drill or a ball end mill, and due to a high pressure formed during a high-feed cutting, the inventors of the present invention discovered that cutting lifespan may be improved by restraining micro-brittle wear when a tip end polishing, in which a portion of wear-resistant layer formed at a bottom cutting edge part including a ultra-low speed region of the tip end central part of the drill is partially removed within a range of 0.01 R to 0.8 R in radius (1.6 R in diameter) from the center of the tip end, is performed through a process such as lapping as illustrated in FIG. 2.

Also, as illustrated in FIG. 3, it is discovered that when a portion of or the entirety of a wear-resistant layer formed on a clearance surface belonging to an ultra-low speed region during rotational cutting in an insert detachably fastened to a tip end of a drill is removed, more specifically, when a wear-resistant layer is formed on clearance surfaces of one or more inserts which are fastened in a column central part of the drill, and a partial or entire portion of the wear-resistant layer is removed within a range of 0.01 R to 0.8 R in radius from a rotation center through a process such as polishing or lapping, the micro-brittle wear is restrained and the cutting lifespan of the inserts can thereby be improved.

When the water-resistant layer is formed in a single layer, a portion thereof can be removed, or when formed in a multilayer, a portion of or the entirety of each layer constituting the multilayer can be removed. Here, when the ratio of the thickness of the removed thin film to the total thickness of the wear-resistant layer is about 1-90% at a position at which the thin film is maximally removed, the effect of the present invention can be achieved, but the thickness is preferably removed by 5% to 30%.

Also, in case of a clearance surface detachably fastened to the tip end of the drill, when about 1-100% of the total thickness of the wear-resistant layer is removed, the effect of the present invention can be achieved, but the thickness of the thin film is preferably removed by 5% to 30%.

The removed region of the wear-resistant layer should be within a range of 0.01 R to 0.8 R from the center of the tip end. This is because when the removed region of the wear resistant layer exceeds 0.8 R, the lifespan of a cutting tool is decreased due to decrease in wear resistance, and when a region of less than 0.01 R is removed, it is difficult to sufficiently restrain the micro-brittle wear. A desirable range of removing the wear-resistant layer is 0.02 R to 0.6 R, and more desirable range of removing the wear-resistant layer is 0.02 R to 0.5 R.

The cutting tool may be a drill or a ball end mill, but the inventive concept of the present invention includes removing a predetermined region about a central portion of contact in a cutting tool which performs a cutting similar to the drill or the ball end mill and in which the wear and propagation of the wear are generated in a similar mechanism.

The wear-resistant layer may be formed of a single-layered thin film or a multi-layered thin film, and the single layer or the multilayer includes at least one thin film containing at least one kind of element selected from metallic elements of IVa, Va or VIa group in the periodic table, Al, or Si, and at least one kind of non-metallic element selected from N, C, or O. For example, the wear-resistant layer may contain TiCN, TiAlN, TiAlCrN, or $Al_2O_3$.

Hereinafter, the present invention will be described in more detail through exemplary examples of the present invention and comparative examples thereof.

Example 1

A super hard alloy containing 10% of Co was used as a base material, was then cut in a drill shape of model number TPD150B of Korloy Inc., and a wear-resistant layer was formed on a surface of the drill by depositing a TiAlCrN thin film in a thickness of about 5 μm by using a TiAlCr target through an arc ion plating method which is a physical vapor deposition.

A tip end polishing was then performed with respect to the TiAlCrN thin film up to about 0.2 R from the center portion by jetting a media (a composite grinding agent including diamond particles, and polymer particles) with a pressure of 2 bar for 10 seconds by using a micro-blasting apparatus, and thereby the wear-resistant layer was partially removed as illustrated in FIG. 2.

Drilling of 336 holes is then performed, by using a drill for which the tip end polishing is performed as mentioned above, under a cutting speed of 100 m/min, a feed per blade of 0.25 mm/tooth, a hole depth of 50 mm, and a wet cutting condition using SCM440 as a work material.

FIG. 4 is a photograph showing a center and a periphery of a tip end of a drill after performing drilling by means of a drill having a partially removed wear-resistant layer according to example 1 of the present invention.

As shown in FIG. 4, any split or damage to the thin film is rarely observed in the tip end or the drill according to example 1, and also in a surrounding edge portion, non-uniform damage to the thin film is rarely observed.

Example 2

A tip end polishing was performed up to about 0.2 R at a central portion with respect to a commercial drill of Korloy Inc. (a model number TPD130B and a kind of a coated layer PC5300 (TiAlN-system and thin film thickness of about 3 μm)) by jetting a media (a composite grinding agent including diamond particles, and polymer particles) with a pressure of 2 bar for 10 seconds by using an aero-lapping device, and thereby the wear-resistant layer was partially removed as illustrated in FIG. 2A.

Drilling of 570 holes was performed, by using a drill for which the tip end polishing is performed as mentioned above, under a cutting speed of 100 m/min, a feed per blade of 0.25 mm/tooth, a hole depth of 50 mm, and a wet cutting condition using SCM440 as a work material.

FIG. 5 is a photograph showing a center and a periphery of a tip end of a drill after performing drilling by means of a drill having a partially removed wear-resistant layer according to example 2 of the present invention.

As illustrated in FIG. 5, the split or damage to the thin film was rarely observed in the tip end of the drill according to example 2 of the present invention, and a relatively stable wear behavior was shown in comparison with comparative example 4 in which the wear-resistant layer is not partially removed from the same product also in a surrounding edge part.

Example 3

A clearance surface (a shadowed portion in the drawing) of an insert illustrated in FIG. 3 was polished with respect to a product of Korloy Inc. with a model number XOMT07T205-LD and a kind of a coated layer PC5335 to which a TiAlCrN thin film is applied by jetting with a pressure of 2 bar for 10 seconds by using an aero-lapping device, and thereby the wear-resistant layer on a side surface of an insert was partially removed. Through this process, the thickness of the thin film on the clearance surface of the insert was removed by about 3-10%.

The insert according to example 3 prepared as the above was mounted to a drill holder having the diameter of 20 mm as illustrated in FIG. 6, and a cutting test was performed under a cutting condition of: a speed of 150 m/min, a feed per revolution of 0.1 mm/rev, a penetration depth of 90 mm, and a wet condition, using SCM440 as a work material.

As illustrated on the left side of FIG. 7, it can be understood from the state of the insert after drilling 130 holes that the insert according to example 3 of the present invention has an improved chipping-resistance and wear-resistance of the clearance surface in comparison with comparative example 5 under the above-mentioned cutting condition.

Next, the insert according to example 3 was mounted to a drill holder having the diameter of 20 mm, and a cutting test was then performed under a cutting condition: a speed of 120 m/min, a feed per revolution of 0.08 mm/rev, a penetration depth of 90 mm, a wet condition, using STS304 as a work material.

As illustrated in FIG. 8, while the lifespan ended at an average of 40 holes in case of the insert according to comparative example 5, the lifespan ended at an average of 140 holes or more in case of the insert according to example of the present invention, and therefore, it can be understood that the lifespan in the example 3 is remarkably improved than that in the comparative example 5.

Comparative Example 1

A super hard alloy containing 10% of Co was used as a base material, was then cut in a drill shape of model number TPD150B of Korloy Inc., and a wear-resistant layer was formed on the surface of the drill by depositing a TiAlCrN thin film at a thickness of about 5 μm by using a TiAlCr target through an arc ion plating method which is a physical vapor deposition.

By means of the drill on which the wear-resistant layer is formed as described above, 336 holes were drilled under the same condition as the examples.

FIG. 9 is a photograph showing a center and a periphery of a tip end of a drill after performing drilling by means of the drill having a wear-resistant layer formed thereon according to comparative example 1.

As illustrated in FIG. 9, a thin film is peeled off in a spiral shape at the tip end of the drill according to comparative example 1, substantial deformation is also observed in a base material on a layer under the thin film, and the damaged thin film is shown to be substantially propagated to a periphery.

When comparing this result with that in the examples of the present invention, although comparative example 1 has the same condition as example 1 of the present invention except that only the tip end polishing was not performed, it can be understood that there is a remarkable difference in cutting performance.

Comparative Example 2

A super hard alloy containing 10% of Co was used as a base material, was then cut in a drill shape of model number TPD150B of Korloy Inc., and a wear-resistant layer was formed on the surface of the drill by depositing a TiAlN thin film at a thickness of about 3 μm by using a TiAl target through an arc ion plating method which is a physical vapor deposition.

By means of the drill on which the wear-resistant layer is formed as described above, drilling was performed under the same condition as the examples.

FIG. 10 is a photograph showing a center and a periphery of a tip end of a drill after performing drilling by means of the drill having a wear-resistant layer formed thereon according to comparative example 2.

As illustrated in FIG. 10, it is not observed that a thin film is peeled off in a spiral shape at the tip end of the drill according to comparative example 2, but it is observed that wear was generated irregularly at peripheral edge portions.

Comparative Example 3

A super hard alloy containing 10% of Co was used as a base material, was then cut in a drill shape of model number TPD150B of Korloy Inc., and a wear-resistant layer having a total thickness of about 8 μm was formed on the surface of the drill by forming a MT-TiCN thin film of 4 μm and an $Al_2O_3$ thin film of 4 μm through a chemical vapor deposition.

By means of the drill on which the wear-resistant layer is formed as described above, drilling was performed under the same condition as the examples.

FIG. 11 is a photograph showing a center and a periphery of a tip end of a drill after performing drilling by means of the drill having a wear-resistant layer formed thereon according to comparative example 3.

As illustrated in FIG. 11, it is also observed that a thin film is peeled off in a tornado-like shape at the tip end of the drill according to comparative example 3, and that wear was also generated irregularly at peripheral edge portions.

Comparative Example 4

Drilling was performed under the same condition as example 2 by means of a commercial drill (model number TPD130B, coating layer type PC5300 (TiAlN, thin film thickness of about 3 μm) from Korloy Inc.

FIG. 12 is a photograph showing a center and a periphery of a tip end of a drill after performing drilling by means of the drill having a wear-resistant layer formed thereon according to comparative example 4.

As illustrated in FIG. 12, the tip end of the drill according to comparative example 4 shows a damaged shape of the original shape due to progress of wear and wear is also widely observed at peripheral edge portions.

Comparative Example 5

Cutting test was performed under the same condition as that in example 3 to compare comparative example 5 with example 3 by using a product from Korloy Inc. with a model number XOMT07T205-LD and a material type PC5335, on which the polishing with respect to the clearance surface of an insert as in example 3 was not performed, and as illustrated in FIGS. 7 and 8, it can be understood that the cutting performance is remarkably decreased in comparison with that in example 3.

Form the results above, it can be understood that when tip end polishing according to an embodiment of the present invention is performed, micro-brittle wear generated in a ultra-low speed region in a central portion during cutting by a drill or a ball end mill can be decreased, and thus the lifespan of a tool, such as a drill or a ball end mill, which cuts a work material while the center of the tip end of the tool contacts the work material, can be improved.

Also, it can be understood that when a wear-resistant layer is partially removed by partially polishing a clearance surface of an insert detachably fastened to a tip end, micro-brittle wear occurring in a ultra-low speed region in a central portion during rotational cutting can be decreased, and thus the lifespan of the insert tool which cuts a work material while the center of the tip end of the tool contacts the work material, can be remarkably improved.

The invention claimed is:

1. A cutting tool formed in a columnar shape to cut a work material by rotating a tip end thereof,
    wherein a base material for the tip end of the cutting tool is a sintered alloy,
    wherein a wear-resistant layer is formed on the tip end, the wear-resistant layer having a partially removed region and a non-removed region,
    wherein an entirety of the partially removed region spans from 0.01 to 0.8 in radius from the center of the tip end based on a total radius of the tip end,
    wherein a thickness of the entirety of the partially removed region is about 1-90% of a total thickness of the non-removed region so that the entirety of the partially removed region is thinner than the non-removed region.

2. The cutting tool of claim 1, wherein the cutting tool is a drill or a ball end mill.

3. The cutting tool of claim 1, wherein the wear-resistant layer is formed in a single-layered or a multi-layered film.

4. The cutting tool of claim 1, wherein the wear-resistant layer comprises one or more layers of the thin film which comprises
    at least one metallic element selected from elements of IVa, Va or VIa group in the periodic table, Al or Si, and
    at least one non-metallic elements selected from N, C, or O.

5. The cutting tool of claim 1, wherein the wear-resistant layer comprises a TiCN layer or $Al_2O_3$ layer.

* * * * *